United States Patent
Shen et al.

(10) Patent No.: US 8,881,084 B2
(45) Date of Patent: Nov. 4, 2014

(54) FINFET BOUNDARY OPTIMIZATION

(75) Inventors: Jeng-Jung Shen, Kaoshiung (TW);
Shao-Ming Yu, Zhubei (TW);
Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 452 days.

(21) Appl. No.: 12/780,426

(22) Filed: May 14, 2010

(65) Prior Publication Data

US 2011/0282478 A1    Nov. 17, 2011

(51) Int. Cl.
G06F 17/50    (2006.01)

(52) U.S. Cl.
CPC .................................. *G06F 17/5081* (2013.01)
USPC ........................................................ 716/122

(58) Field of Classification Search
CPC . G06F 17/5068; G06F 17/50; G06F 17/5081; G06F 17/5072
USPC ........................................................ 716/122
See application file for complete search history.

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |
| 7,190,050 B2 | 3/2007 | King et al. |
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 2003/0145299 A1* | 7/2003 | Fried et al. ........................ 716/11 |
| 2005/0020015 A1* | 1/2005 | Mathew et al. ............... 438/277 |
| 2005/0136582 A1* | 6/2005 | Aller et al. ..................... 438/197 |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2008/0258228 A1 | 10/2008 | Chuang et al. |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Vuthe Siek
*Assistant Examiner* — Aric Lin
(74) *Attorney, Agent, or Firm* — Haynes and Boone, LLP

(57) ABSTRACT

A method for generating a layout for a semiconductor device is disclosed. The method includes: receiving a first layout. A portion of the first layout is defined as a first FinFET region. The first FinFET region has first and second sides that each extend approximately in a first direction. The method includes performing a first design rule check (DRC) simulation. The method includes obtaining a first DRC simulation result. The method includes defining a second FinFET region by moving the first side in a second direction perpendicular to the first direction. The method includes performing a second DRC simulation. The method includes obtaining a second DRC simulation result. The method includes selecting one of the first and second FinFET regions based on the first and second DRC simulation results. The method includes generating a second layout using the selected FinFET region.

20 Claims, 9 Drawing Sheets

(56) References Cited

U.S. PATENT DOCUMENTS

| | | |
|---|---|---|
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0248481 A1* | 9/2010 | Schultz .................. 438/694 |
| 2010/0264468 A1 | 10/2010 | Xu |

OTHER PUBLICATIONS

Hsien-Hsin Lin, et al., U.S. Appl. No. 12/703,918, "Method for Fabricating A Finfet Device," filed Feb. 11, 2010, 40 pages.

Chien-Chang Su, et al., U.S. Appl. No. 12/644,869, "Method For Incorporating Impurity Element In EPI Silicon Process," filed Dec. 22, 2009, 21 pages.

Tsung-Lin Lee, et al., U.S. Appl. No. 12/622,038, "Sacrificial Offset Protection Film For A Finfet Device," filed Nov. 19, 2009, 56 pages.

Jeff J. Xu, et al., U.S. Appl. No. 12/784,207, "Method of Forming EPI Film In Substrate Trench," filed May 20, 2010, 33 pages.

Tian-Choy, et al., U.S. Appl. No. 12/756,552, "Hybrid Gate Process For Fabricating Finfet Device," filed Apr. 8, 2010, 38 pages.

Ming-Lung Cheng, et al. U.S. Appl. No. 12/780,124, "Method And Apparatus For Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit For Finfet Devices," filed Jun. 30, 2010, 32 pages.

Jhon Jhy Liaw, U.S. Appl. No. 12/823,860, "Structure And Method For SRAM Cell Circuit," filed Jun. 25, 2010, 37 pages.

Jhon Jhy Liaw, et al., U.S. Appl. No. 12/827,690, "Layout For Multiple-Fin SRAM Cell," filed Jun. 30, 2010, 35 pages.

Jeng-Jung Shen, et al., U.S. Appl. No. 12/780,060, "Automatic Layout Conversion For Finfet Device," filed May 14, 2010, 29 pages.

Yu-Lien Huang, et al., U.S. Appl. No. 12/840,830, "High Surface Dopant Concentration Semiconductor Device And Method Of Fabricating," filed Jul. 21, 2010, 21 pages.

Peng-Soon Lim, et al., U.S. Appl. No. 12/827,512, "Gate Structures And Method Of Fabricating Same," filed Jun. 30, 2010, 41 pages.

Tsu-Hsiu Perng, et al., U.S. Appl. No. 12/837,093, "Fin-Like Field Effect Transistor (Finfet) Device And Method Of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor On Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device And Method Of Manufacturing Same," filed Oct. 18, 2010, 55 pages.

Jeff J. Csu, et al, U.S. Appl. No. 12/917,902, "Fin-Like Field Effect Transistor (FINFET) Device And Method Of Manufacturing Same," filed Nov. 2, 2010, 61 pages.

Mark van Dal, U.S. Appl. No. 12/900,895, "Method Of Fabricating A Semiconductor Device Having An Epitaxly Region," filed Oct. 8, 2010, 21 pages.

Hsin-Chih Chen, et al, U.S. Appl. No. 12/907,272, "Multi-Fin Device By Self-Aligned Castle Fin Formation," filed Oct. 19, 2010, 34 pages.

Chien-Hsun Wang, et al, U.S. Appl. No. 12/952,376, "Method For Adjusting Fin Width In Integrated Circuitry," filed Nov. 23, 2010, 27 pages.

Chien-Shun Wang, et al, U.S. Appl. No. 12/949,881, "Method For Forming Metrology Structures From Fins In Integrated Circuitry," filed Nov. 19, 2010, 16 pages.

Chien-Hsun Wang, et al, U.S. Appl. No. 12/953,148, "Device And Method For Forming Fins In Integrated Circuitry," filed Nov. 23, 2010, 39 pages.

* cited by examiner

FINFET BOUNDARY OPTIMIZATION

FIELD OF THE INVENTION

The present disclosure relates generally to a semiconductor device, and more particularly, to the layout of a FinFET device.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

Fabrication of FinFET devices usually requires a computed-aided design (CAD) layer that defines the boundary of FinFET devices. This is done so that the FinFET devices can be fabricated in an area of a chip separate from traditional semiconductor devices (referred to as planar devices). When a semiconductor foundry receives a design layout from a customer, this FinFET boundary is usually not defined, since a customer may have implemented the layout of its chip using only planar devices. Consequently, the foundry may need to convert portions of the chip from a planar layout to a FinFET layout. However, this conversion process may violate a number of FinFET design rules.

Therefore, while existing methods of fabricating FinFET devices have been generally adequate for their intended purposes, they have not been entirely satisfactory in every aspect.

SUMMARY

One of the broader forms of the present disclosure involves a method of generating a layout for a semiconductor device. The method includes: receiving a first layout; defining a portion of the first layout as a first FinFET region, the first FinFET region having first and second sides that each extend approximately in a first direction; performing a first design rule check (DRC) simulation; obtaining a first DRC simulation result; defining a second FinFET region by moving the first side in a second direction perpendicular to the first direction; performing a second DRC simulation; obtaining a second DRC simulation result; selecting one of the first and second FinFET regions based on the first and second DRC simulation results; and generating a second layout using the selected FinFET region.

Another one of the broader forms of the present disclosure involves a method of generating a layout for a semiconductor device. The method includes: defining a portion of an initial layout plan as an initial FinFET region, the initial FinFET region having first and second sides that each extend substantially in a first direction; performing an initial design rule check (DRC) simulation based on the initial FinFET region; collecting initial DRC simulation results from the initial DRC simulation; performing a plurality of layout iterations until a predefined condition is satisfied, each layout iteration including: shifting the first side away from the second side by a distance measured in a second direction substantially perpendicular to the first direction, thereby defining a modified FinFET region; performing a modified DRC simulation based on the modified FinFET region; and collecting modified DRC simulation results from the modified DRC simulation; wherein the shifting is carried out in a manner so that, for each layout iteration, the distance by which the first side is shifted increases; comparing the initial DRC simulation results with the modified DRC simulation results associated with each layout iteration; choosing, in response to the comparing, an optimized FinFET region from the group consisting of the initial FinFET region and the modified FinFET regions defined by the plurality of layout iterations; generating an updated layout plan based on the optimized FinFET region; and fabricating a FinFET device using the updated layout plan.

Yet another one of the broader forms of the present disclosure involves an apparatus that includes a non-transitory, tangible computer readable storage medium storing a computer program for modifying a layout of a semiconductor device, wherein the computer program has instructions that when executed, carries out: defining a portion of the initial layout plan as an initial FinFET region, the initial FinFET region having first and second sides that each extend substantially in a first direction; performing a design rule check (DRC) simulation based on the initial FinFET region; gathering DRC results for each DRC simulation; repeating the defining, the performing, and the gathering for a plurality of iterations, the iterations respectively defining a plurality of revised FinFET regions by moving the first side away from the second side in a second direction perpendicular to the first direction, wherein the first side is moved by an increasing amount for each iteration; thereafter selecting one FinFET region from the group consisting of the initial FinFET region and the revised FinFET regions; and generating a modified layout that contains the selected FinFET region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
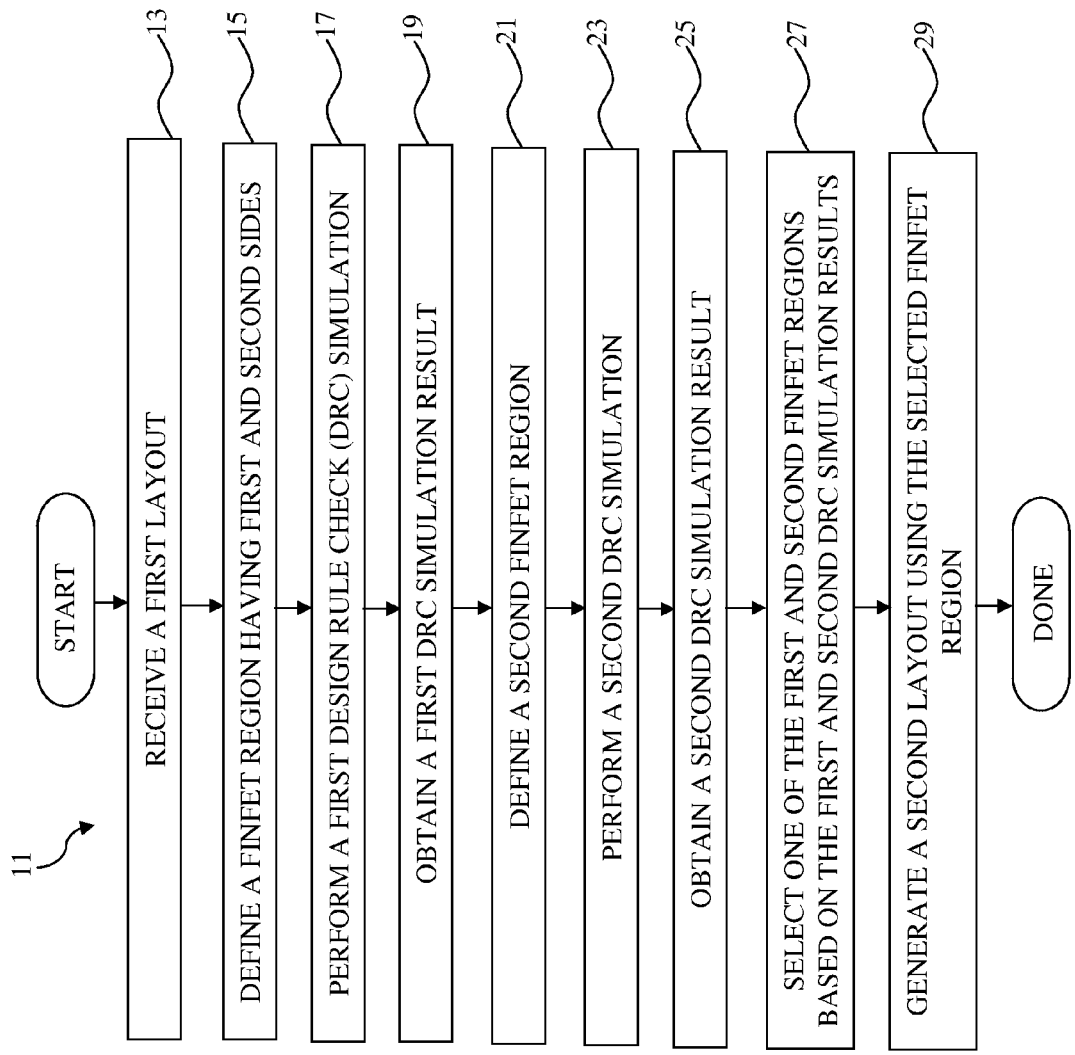
FIG. 1 is a flow chart of a method for generating a layout for a semiconductor device in accordance with aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

FIG. 1 is a flowchart of a method 11 for generating a layout for a semiconductor device in accordance with various aspects of the present disclosure. The method 11 begins with block 13 in which a first layout is received. The first layout has an active region. The active region has a side. The method 11 continues with block 15 in which a portion of the first layout is defined as a FinFET region. The FinFET region has first and second sides that each extend approximately in a first direction. The method 11 continues with block 17 in which a first design rule check (DRC) simulation is performed. The method 11 continues with block 19 in which a first DRC simulation result is obtained. The method 11 continues with block 21 in which a second FinFET region is defined by moving the first side in a second direction perpendicular to the first direction. The method 11 continues with block 23 in which a second DRC simulation is performed. The method 11 continues with block 25 in which a second DRC simulation result is obtained. The method 11 continues with block 27 in which one of the first and second FinFET regions is selected based on the first and second DRC simulation results. The method 11 continues with block 29 in which a second layout is generated using the selected FinFET region. It is understood that additional steps can be provided before, during, and after the method 11, and some of the steps described below can be replaced or eliminated, for additional embodiments of the methods.

The use of FinFET devices has been gaining popularity in the semiconductor industry. A FinFET device is a non-planar multi-gate transistor that is built on a substrate. A thin silicon "fin-like" structure (referred to as fin) forms the body of the FinFET. The gate of the FinFET device is wrapped around this fin. The source and drain of the FinFET are formed in extensions of the fin on opposite sides of the gate. The fin itself serves as a channel. The effective channel length of the FinFET device is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. However, the designer of the IC chip (e.g., a design house) may not have the necessary tools to perform the physical layout of the FinFET devices, or that it may be inconvenient for the designer to do so. Therefore, a designer of an IC chip may design a portion of the IC chip to be eventually implemented with FinFET devices, but may perform the initial physical layout of the IC chip using traditional planar MOSFET devices in place of FinFET devices.

The initial layout plan may be given to a different entity such as a foundry for fabrication. In accordance with an embodiment of the present disclosure, the foundry which may then convert the initial layout to a new layout such that the traditional planar devices may be converted into FinFET devices. A FinFET boundary region will be automatically defined/generated based on the initial layout. The initial layout plan may also contain a plurality of active regions in which FinFET devices are eventually to be formed. In accordance with embodiments of the present disclosure, geometries of these active regions in the initial layout are automatically adjusted to minimize FinFET Design Rule violations that may otherwise occur in the layout conversion process. The ensuing Figures and discussions explain this layout conversion process and the Design Rules in greater detail.

Figure 2:
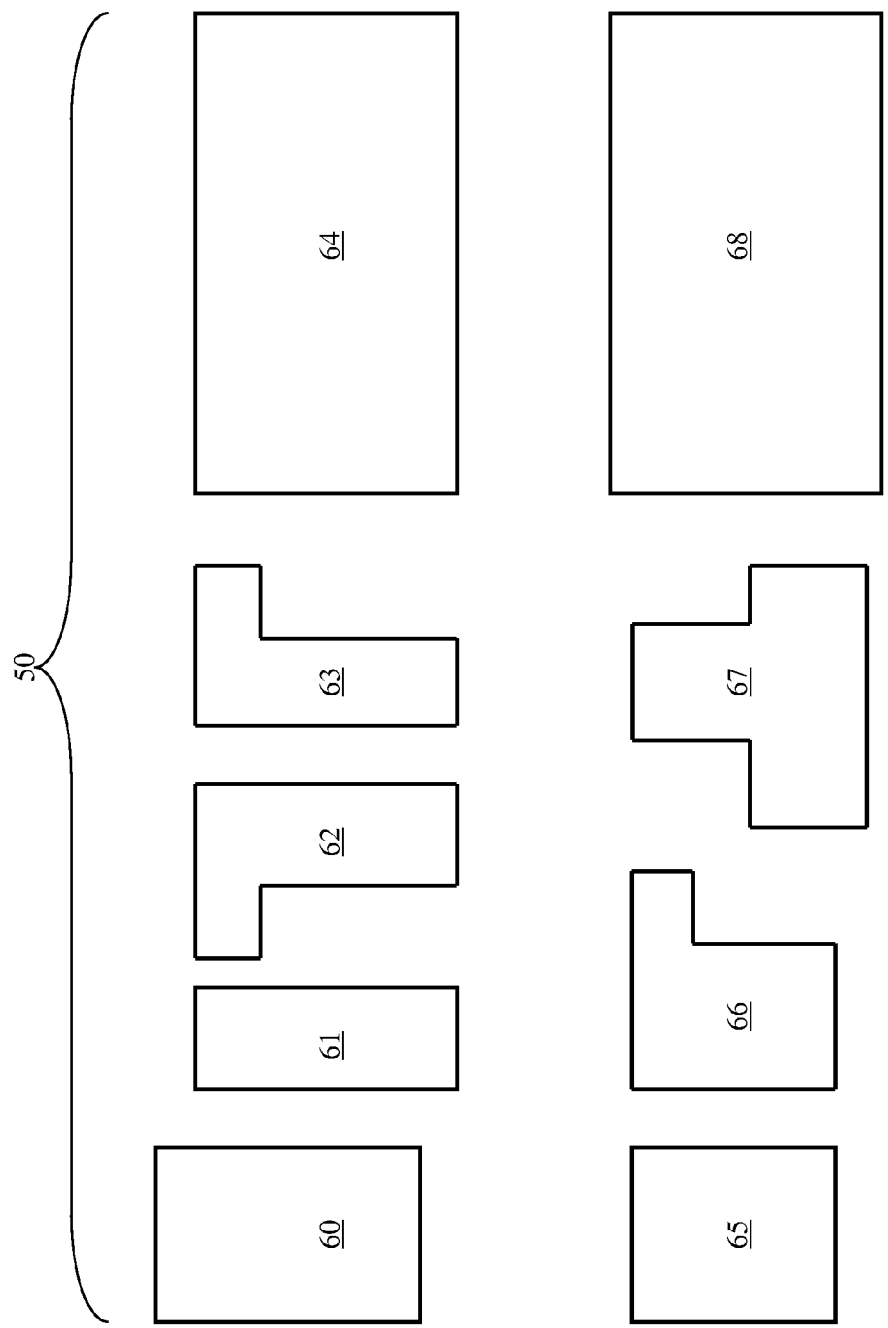
FIGS. 2-8 are diagrammatic fragmentary top views of a portion of a layout of a semiconductor device at different stages of layout generation in accordance with aspects of the present disclosure.

FIG. 2 illustrates a top view of a portion of an initial layout plan for an example semiconductor device. As discussed above, the initial layout plan may be provided by a design house. It is understood, however, that the initial layout plan may be generated by other entities such as a third party layout provider or even by the foundry itself. The initial layout plan includes a computer file (or virtual plan) that defines a physical layout of the example semiconductor device. The example semiconductor device may be an IC chip and may include millions of digital or analog transistors. The initial layout plan may also include multiple layers. For the sake of simplicity and clarity, only a portion 50 of the initial layout plan is shown herein. The portion 50 is a "snapshot" of a selected one or more layers of the initial layout plan within a predefined region of the initial layout plan.

As is shown in FIG. 2, the portion 50 includes a plurality of active regions 60-68. The active regions 60-68 are regions of a substrate where transistors (not illustrated) of the example semiconductor device will be formed. It is understood that the active regions 60-68 are merely examples for the sake of facilitating ensuing discussions, and that any number of other active regions may be included in the portion 50, and they may have shapes or geometries different from the active regions 60-68.

According to the initial layout plan, the transistors in the active regions 60-68 may have been designed to function as FinFET devices, but they may have been laid out as traditional planar transistor devices. To convert these planar transistor devices into FinFET devices, a region that is reserved for the formation of FinFET devices needs to be defined first. In other words, an area in the portion 50 of the initial layout plan needs to be specifically designated or assigned, so that FinFET devices will be formed in this area eventually. This region is thereafter referred to as a FinFET region.

The FinFET region is defined in a two-step process. First, referring to FIG. 3, virtual or temporary boundary lines are drawn around each of the active regions 60-68. Alternatively stated, the boundaries of each of the active regions 60-68 are "virtually moved" outwards, in both an X-direction and a Y-direction that is perpendicular to the X-direction. The X-direction extends horizontally in FIG. 2, and the Y-direction extends vertically in FIG. 2. For the sake of simplicity, the virtually moved boundaries are shown only for the active regions 60 and 68.

The boundaries of the active regions 60-68 are each virtually moved in this following manner: if a side of the active region extends in the X-direction, it will be virtually moved in the Y-direction; if a side of the active region extends in the Y-direction, it will be virtually moved in the X-direction.

The amount of virtual movement in the X-direction is approximately equal to a first number that is dependent on a fabrication process margin that may be process-specific. For a 32-nanometer (nm) technology node/process, the first number is approximately 0.03 microns (um). The amount of virtual movement in the Y-direction is approximately equal to a second number that is a function of several parameters including mandrel pitch, mandrel width, and fin width. These parameters will be illustrated in later drawings and will be discussed in more detail later. In an embodiment, the second number is approximately equal to: 2×(mandrel pitch)−½×(mandrel width)−(fin width). It is understood that the physical boundaries of the active regions 60-68 are not actually moved. The boundaries are "virtually moved" to help define the boundaries of the FinFET region.

After these virtual boundaries are generated for each of the active regions 60-68, a collective virtual boundary outline can be drawn around these active regions as a whole. The collective virtual boundary outline may have a somewhat irregular shape. For example, it may not be a perfect rectangle. As a second part of the FinFET region definition process, an irregularly-shaped collective virtual boundary outline is "rectangularized" to define a substantially rectangular boundary of the FinFET region.

Figure 3:
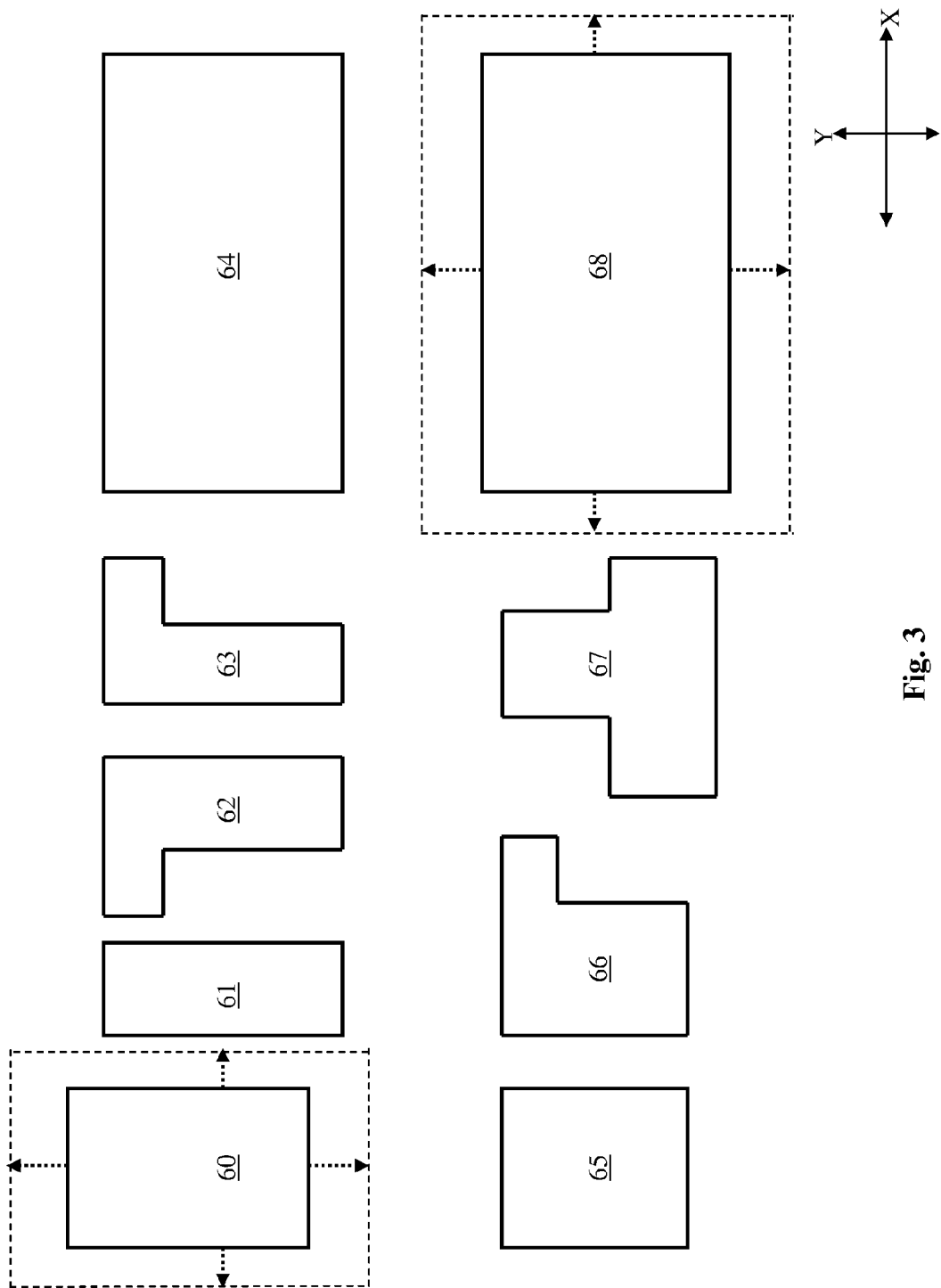
Figure 4:
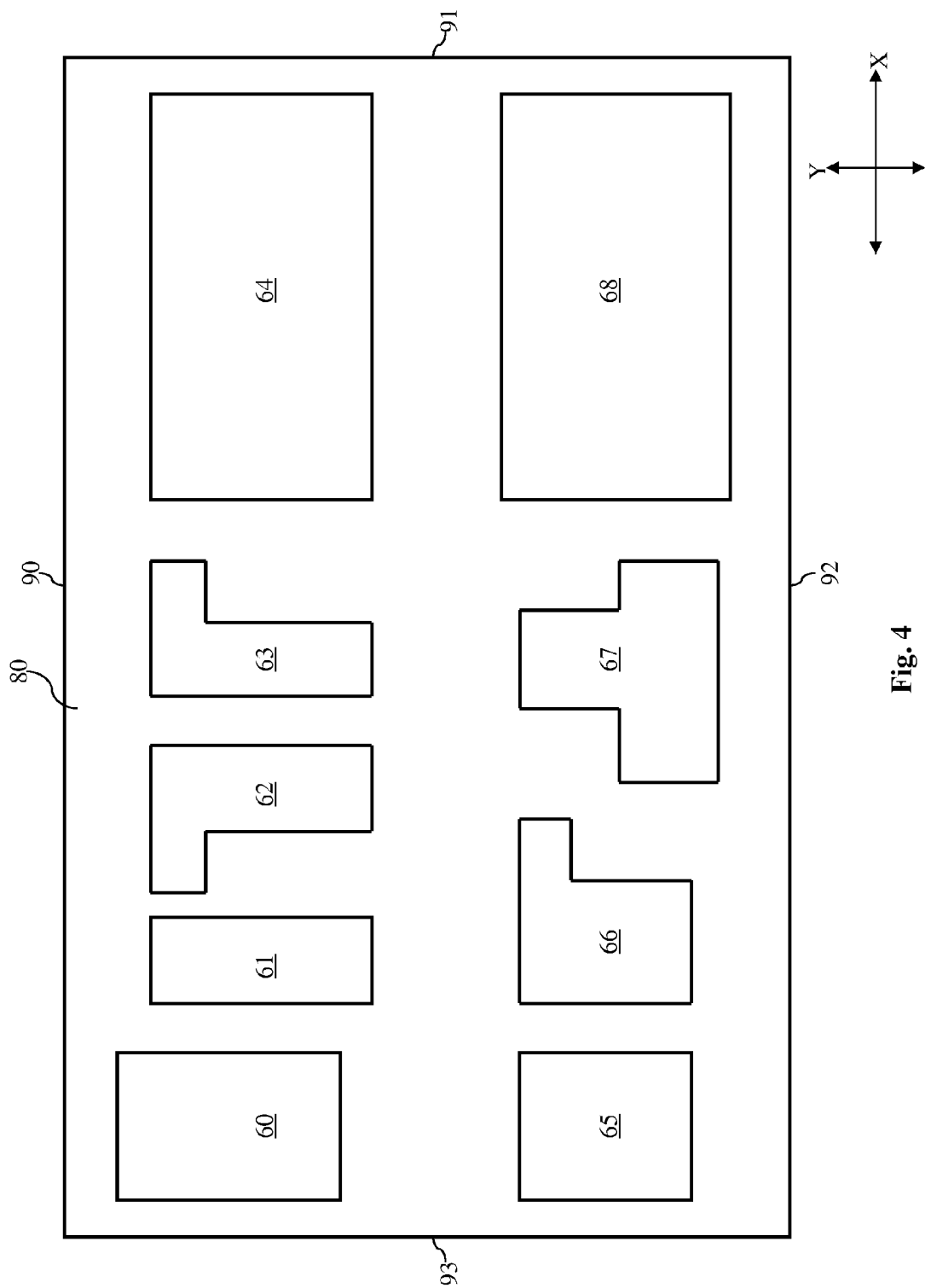

Referring to FIG. 4, this "rectangularized" FinFET region is labeled with the reference numeral 80. The active regions 60-68 are all located within the FinFET region 80. The FinFET region 80 has four sides (or edges) 90, 91, 92, and 93. The sides 90 and 92 each extend substantially in the X-direction. The sides 91 and 93 each extend substantially in the Y-direction. As discussed above in association with FIG. 3, the sides 91 and 93 are each spaced apart from the nearest active region (for example, the active region 64 and the active region 65, respectively) by the first number. Meanwhile, the sides 90 and 92 are spaced apart from the nearest active region (for example, the active region 60 and the active region 68, respectively) by the second number.

Figure 5:
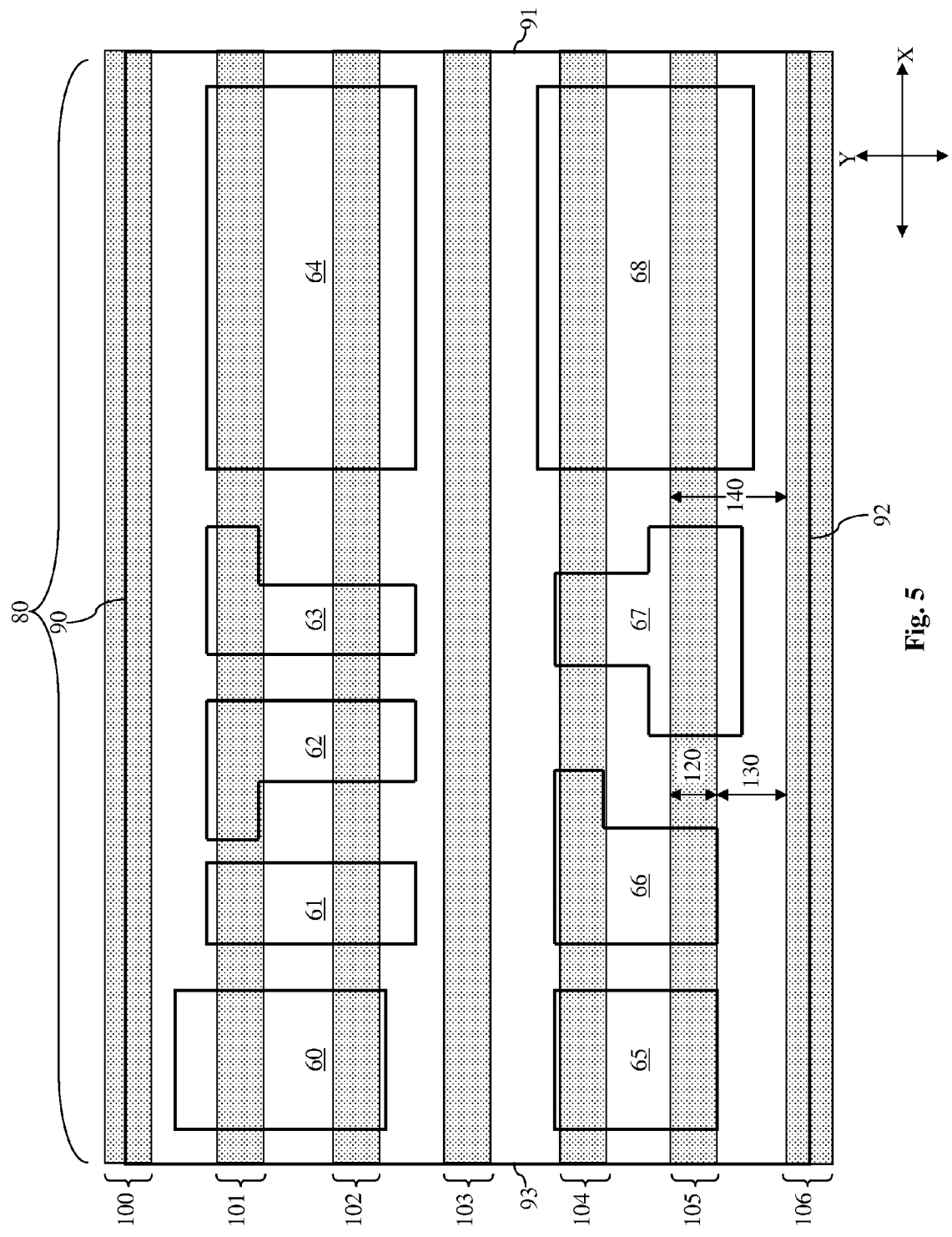

Referring now to FIG. 5, a plurality of elongate mandrel regions 100-106 are defined (or assigned/designated) in the FinFET region 80. The mandrel regions 100-106 are reserved for the formation of mandrels as part of the fabrication process for the FinFET devices in the FinFET region 80. In more detail, the mandrels serve as dummy layers and help define the fins of the FinFET devices. The mandrels will eventually be removed during the fabrication processing of the FinFET devices.

The mandrel regions 100-106 each extend substantially in the X-direction. The mandrel regions 100-106 also each have a width measured in the Y-direction and are spaced apart from one another in the Y-direction. In the embodiment shown in FIG. 5, the mandrel regions 100-106 all have equal widths 120 and are spaced apart evenly by a distance 130. In addition, the mandrel regions 100-106 have a pitch 140 that is a sum of the width 120 and the distance 130. The specific values of the width 120 and the distance 130 may vary depending on the fabrication process. For example, for a 32-nm technology node/process, the width 120 of the mandrel regions 100-106 is approximately equal to 40 nm, and the distance 130 separating the mandrels is approximately equal to 60 nm. Hence, the pitch 140 of the mandrel regions 100-106 is approximately equal to 100 nm. It is understood that in other embodiments, the mandrel regions 100-106 may each have a different width, and may be spaced apart unevenly, and may not extend substantially in the X-direction.

The mandrel regions 100-106 are defined in the following manner: the mandrel region 106 is defined first; then the mandrel region 105 is defined to be spaced apart from the mandrel region 106 by the distance 130; thereafter the mandrel region 104 is defined to be spaced apart from the mandrel region 105 by the distance 130, so on and so forth. Thus, the initial location of the "bottom-most" mandrel region 106 sets the locations of the rest of the mandrel regions 100-105.

As shown in FIG. 5, the mandrel region 100 is divided by the side 92 of the FinFET region 80. In an embodiment, the mandrel region 100 is substantially bisected (divided in the middle) by the side 92. It is understood that in another embodiment, the order of definition of the mandrel regions 100-106 may be reversed, so that the mandrel region 100 is defined first (and bisected by the side 90 of the FinFET region 80), and the mandrel regions 101-106 are thereafter defined in a similar manner.

Figure 6:
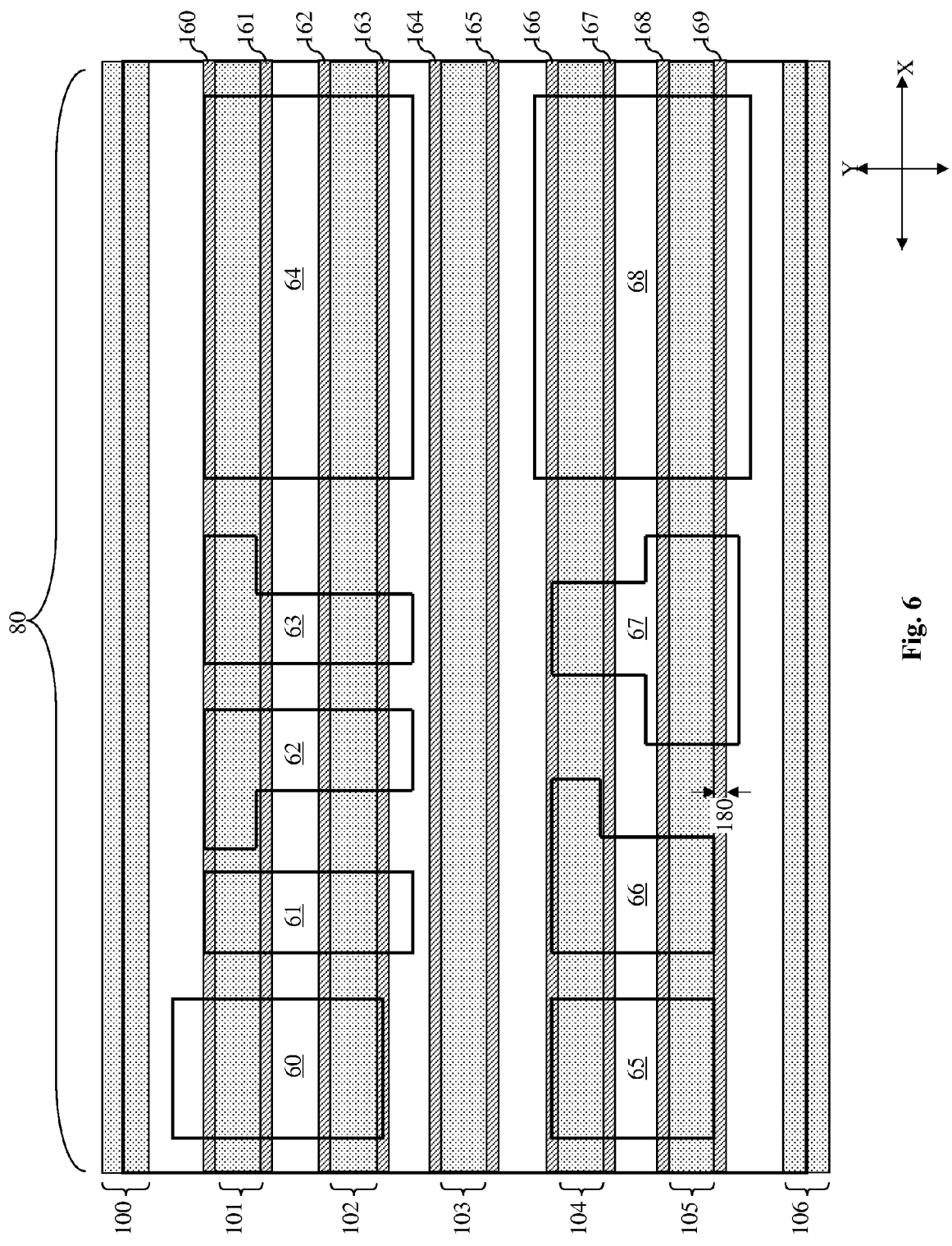

Referring now to FIG. 6, a plurality of elongate fin regions 160-169 are defined (or assigned/designated) in the FinFET region 80. Specifically, the fin regions 160-161 are defined to be adjacent to opposite sides of the mandrel region 101, the fin regions 162-163 are defined to be adjacent to opposite sides of the mandrel region 102, the fin regions 164-165 are defined to be adjacent to opposite sides of the mandrel region 103, the fin regions 166-167 are defined to be adjacent to opposite sides of the mandrel region 104, and the fin regions 168-169 are defined to be adjacent to opposite sides of the mandrel region 105.

The fin regions 160-169 each extend substantially in the X-direction and are spaced apart in the Y-direction. The fin regions 160-169 each have an elongate side that is abutted (bordering) to an elongate side of one of the respective mandrel regions 101-105 disposed therebetween. The fin regions 160-169 also each have a width measured in the Y-direction. In the embodiment shown in FIG. 5, the fin regions 160-169 all have equal widths 180. The specific value of the width 180 may vary depending on the fabrication process. For a 32-nm technology process, the width 180 of the fin regions 160-169 is approximately equal to 10 nm. It is understood that in other embodiments, the mandrel regions 160-169 may each have a different width, and may be spaced apart unevenly, and may not extend substantially in the X-direction.

Recall from the discussions associated with FIG. 3, the second number (used for the definition of the FinFET region—specifically, the virtual distance by which each active region 60-68 is moved in the Y-direction) is defined to be a function of the parameters mandrel width, mandrel pitch, and fin width. Now, with reference to FIGS. 5 and 6, the parameter mandrel width is the width 120 (shown in FIG. 5), the parameter mandrel pitch is the pitch 140 (shown in FIG. 5), and the parameter fin width is the width 180 (shown in FIG. 6). Thus, for a 32-nm technology process, the second number is approximately equal to 2×(the pitch 140)−½×(the width 120)−(the width 180)=2×100 nm−½×(40 nm)−10 nm=170 nm, or 0.17 um.

A Design Rule Check (DRC) simulation may be performed at this point. The DRC simulation helps determine whether a physical layout of an IC chip satisfies a series of parameters known as Design Rules. Design Rules set forth geometric and connectivity restrictions with respect to various components on the IC chip, so that there is sufficient margin to account for processing variations occurring during semiconductor fabrication. For example, Design Rules may include a width rule that specifies the minimum width of a component of the IC chip. As another example, Design Rules may also include a spacing rule that specifies the minimum spacing between two adjacent components of the IC chip. Numerous other Design Rules exist, and for the sake of simplicity, they are not discussed herein.

Design Rules may be specific to a particular semiconductor fabrication process. Thus, a 32-nm technology node/process may have different Design Rules than a 45-nm technology node/process. In addition, within each technology node/process, its Design Rules may include different subsets of Design Rules. For instance, the Design Rules may include a subset of Design Rules for traditional planar devices, and a different subset of Design Rules for FinFET devices. In the present disclosure, the layout conversion process discussed in association with FIGS. 2-6 thus far may result in a number of Design Rule violations (or Design Rule errors), which may include both planar device Design Rule violations and FinFET Design Rule violations. The numbers of these Design Rule violations are collected and recorded (for example in an electronic database).

Figure 7:
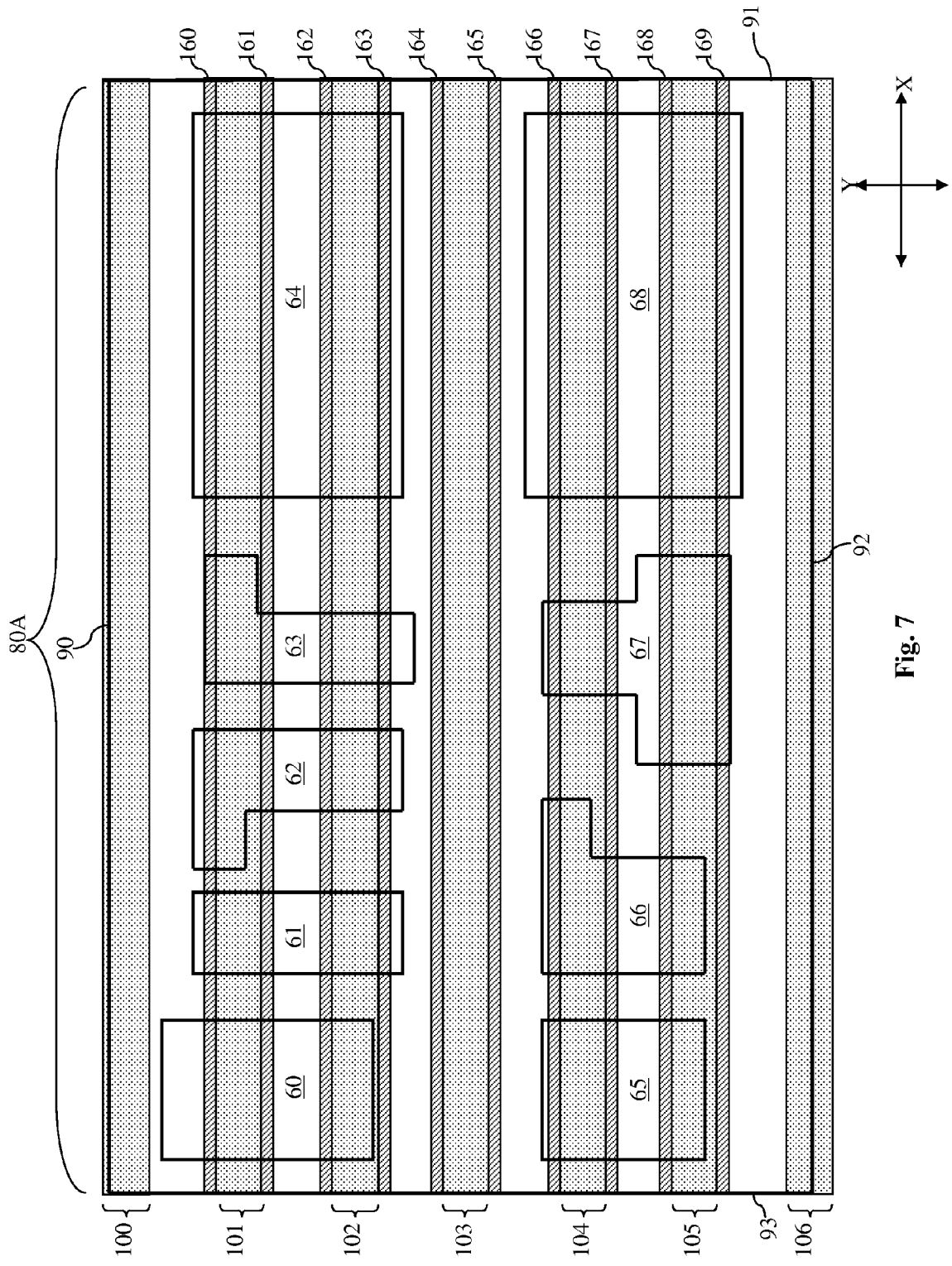

Referring now to FIG. 7, the processes discussed above in association with FIGS. 4-6 are repeated. However, a slightly modified FinFET region 80A is generated in place of the FinFET region 80 (or that the FinFET region 80 is transformed into the FinFET region 80A). In particular, the side 92 of the FinFET region 80A is now "moved downwards" by a predetermined distance. In other words, the side 92 of the FinFET region 80A is shifted away from its opposite side 90 in the Y-direction by the predetermined distance. In one embodiment, the predetermined distance is the maximum resolution (or the finest resolution) of a given layout. Hence, if the smallest movement or shift that can take place in the given layout is M nanometers, then the predetermined distance is equal to M. As an example, M may be approximately equal to 1 nm for a 32-nm technology node/process. The predetermined distance may also be chosen to be greater than the finest resolution of the given layout. As an example, the predetermined distance may be approximately equal to 5 nm, where the finest resolution is approximately equal to 1 nm. The active regions 60-68 are not moved, and they maintain the same position or location that they had in the FinFET region 80 of FIG. 6.

In the present embodiment, the side 90 remains in the same place as it was in the FinFET region 80. Thus, an area of the FinFET region 80 is expanded as the side 92 is shifted downwards. Furthermore, the shifting of the side 92 causes the mandrel region 106 to be defined in a different location—the mandrel region 106 is also shifted downwards by the predetermined distance. As discussed above with reference to FIG. 5, the mandrel regions 100-105 are defined relative to the mandrel region 106. As such, when the mandrel region 106 is shifted in the Y-direction (away from the side 90 of the FinFET region 80) by the predetermined distance, the rest of the mandrel regions 100-105 are also shifted in the same manner. It is understood that in some alternative embodiments, the side 90 may also be shifted downwards in the Y-direction by the same predetermined distance, or by a different predetermined distance.

As FIG. 7 shows, the shifting or the moving of the mandrel regions 100-106 and the fin regions 160-169 (which are formed adjacent to the mandrel regions) changes the relative locations of the active regions 60-68 with respect to the mandrel regions 100-106 and the fin regions 160-169. Such change may result in different Design Rule violations compared to the FinFET region 80 of FIG. 6. Some of the Design Rules that were previously violated may now be satisfied, while other Design rules that were previously satisfied may now be violated. To check the number of Design Rule violations, including both planar device Design Rule violations and FinFET Design Rule violations, another DRC simulation is performed again after the mandrel regions 100-106 and the fin regions 160-169 are defined. The number of planar device Design Rule violations and the number of FinFET Design Rule violations are both recorded again.

Figure 8:
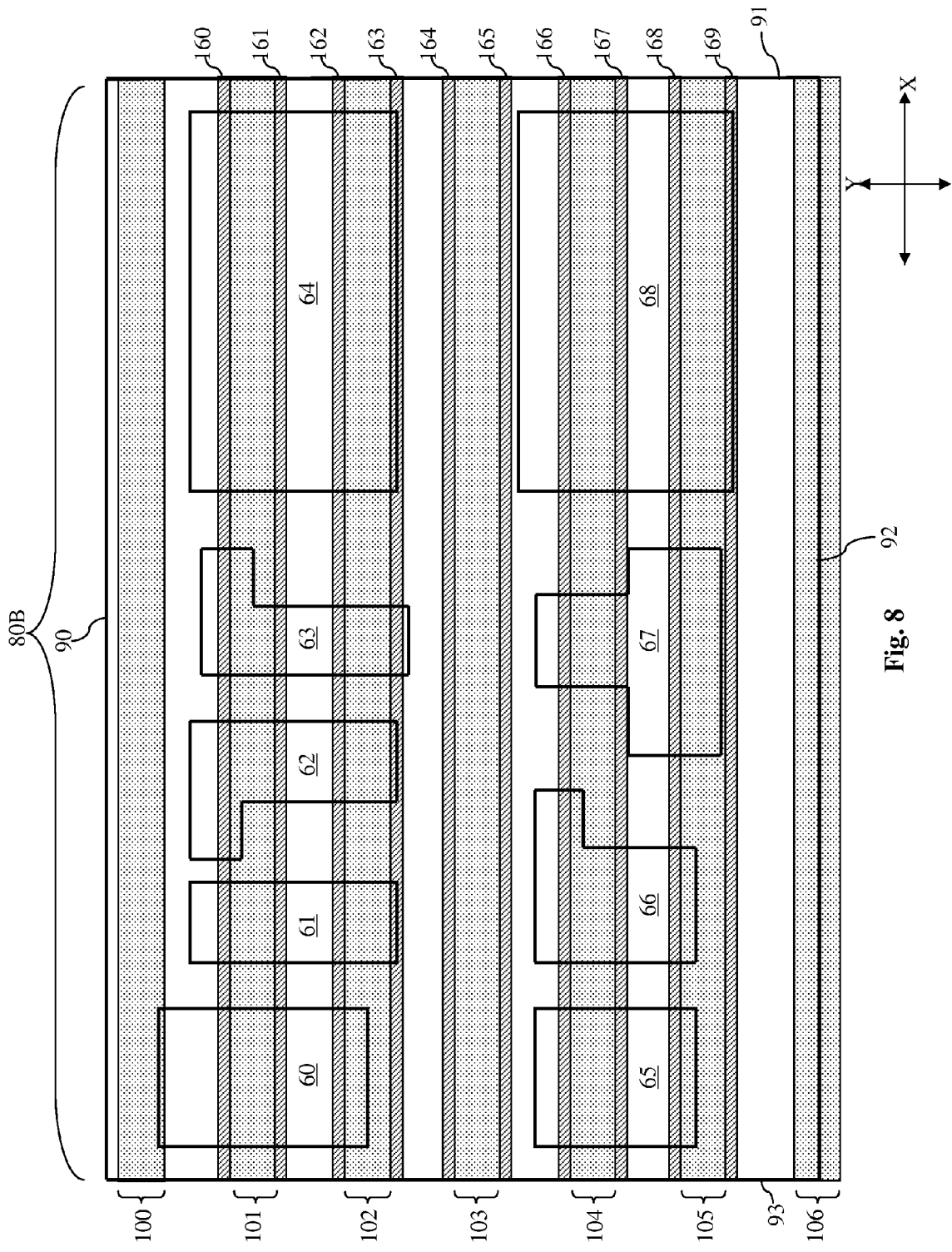

Referring now to FIG. 8, the processes discussed above in association with FIGS. 4-6 are repeated one more time. Similar to what was done in association with FIG. 7, the side 92 of the FinFET region 80A (shown in FIG. 7) is shifted downwards in the Y-direction by the predetermined distance again. Thus a FinFET region 80B is defined. The FinFET region 80B can also be viewed as a revised FinFET region 80 having its bottom side 92 shifted downwards in the Y-direction by a distance that is twice the predetermined distance. The mandrel regions 100-106 and the fin regions 160-169 are also shifted downwards in the Y-direction. The amount of shift for the mandrel regions 100-106 and the fin regions 160-169 is the predetermined distance from where they were in the FinFET region 80A of FIG. 8, or twice the predetermined distance from where they were in the FinFET region 80 of FIG. 7.

After the mandrel regions 100-106 and the fin regions 160-169 are shifted, another DRC simulation is performed, and the number of planar device Design Rule violations and the number of FinFET Design Rule violations associated with the revised FinFET region 80B are both recorded.

This moving/shifting cycle is reiterated until the total distance moved is substantially equal to the distance 130 (shown in FIG. 5), which is the spacing that separates any two of the adjacent mandrel regions 100-106. For example, in an embodiment where the distance 130 is approximately equal to 60 nm, and the predetermined distance (the amount by which the side 92 is shifted for each iteration) is approximately equal to 1 nm, then the total number of iterations performed is 60 (60 nm divided by 1 nm). If the distance 130 is approximately equal to 60 nm, but the predetermined distance is approximately equal to 5 nm, then the total number of iterations performed is 12 (60 nm divided by 5 nm).

A DRC simulation is performed at the end of each iteration of the moving/shifting of the side 92, the mandrel regions 100-106, and the fin regions 160-169. The number of Design Rule violations are also recorded after each DRC simulation. When all the iterations have been completed, an optimized scenario with respect to Design Rule violations is determined. In an embodiment, the optimized scenario has the least number of FinFET Design Rule violations among all the DRC simulation results. In an alternative embodiment, the optimized scenario may involve the least total number of Design Rule violations, which includes both planar device Design Rule violations and FinFET Design Rule violations. In some cases, the optimized scenario may simultaneously have the least number of FinFET Design Rule violations and the least number of total Design Rule violations. The FinFET region corresponding to the optimized scenario is then chosen to generate the new layout. The new layout may still have some Design Rule violations, but the new layout is considered optimized because the number of FinFET Design Rule violations (or total number of Design Rule violations) have been minimized.

Figure 9:
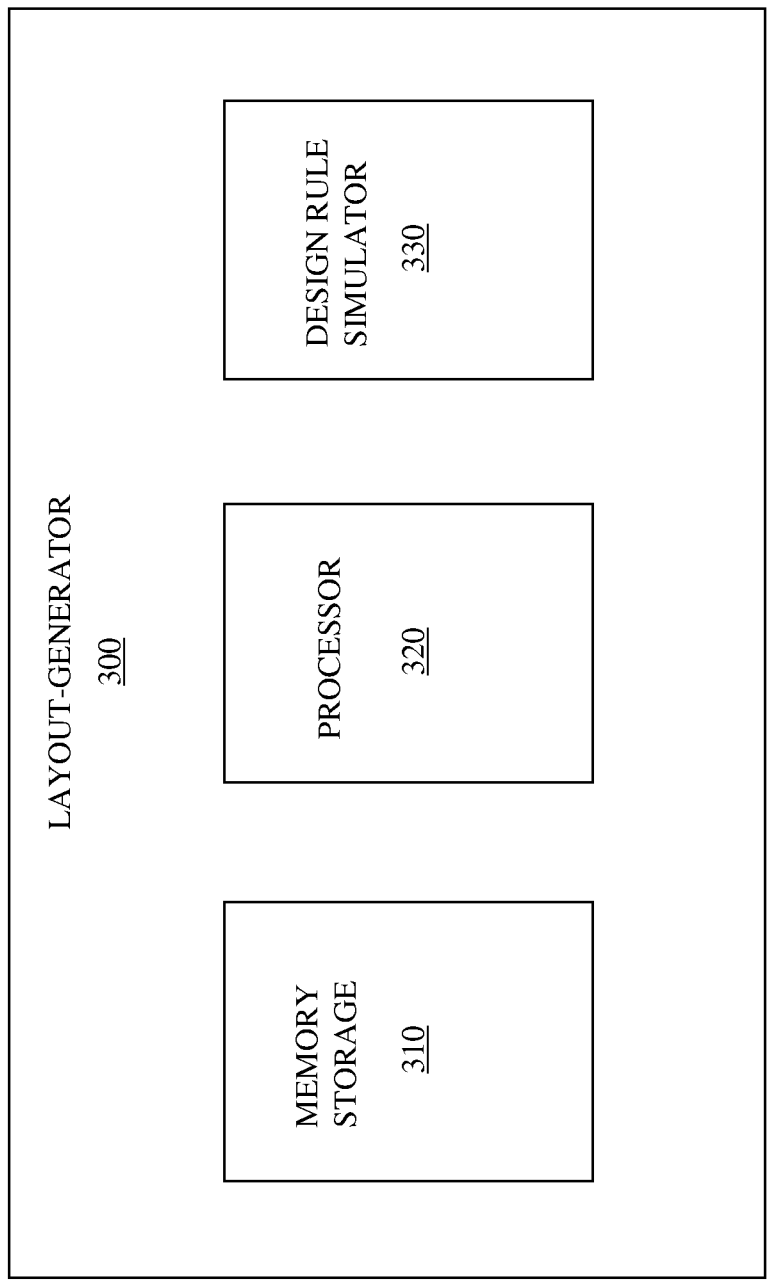
FIG. 9 is a simplified diagrammatic view of a machine that can be used to generate the layout in accordance with aspects of the present disclosure.

FIG. 9 is a simplified diagrammatic view of a layout-generator 300 (or layout-generating machine). The layout-generator 300 includes a machine or tool that can be used to perform the layout conversion process discussed above in association with FIGS. 2-8. The layout generator 300 includes a memory storage component 310, a processor component 320, and a design rule simulator 330. The memory storage component 310 is a non-transitory, tangible computer readable storage medium that stores instructions that can be executed by the processor 320. The instructions contain algorithms used to carry out the various steps of converting an initial layout having planar devices to a layout having FinFET devices. The processor 320 runs those instructions and generates the new layout having FinFET devices. The generated new layout may be stored in the memory storage 310. The design rule simulator 330 includes hardware and software components that carry out the DRC simulations discussed in association with FIGS. 6-8. The design rule simulator 330 may also include the electronic database in which all the DRC simulation results are stored. Alternatively, the DRC simulation results may be stored in the memory storage 310. The new layout may be sent to a photomask fabricator so that photomasks corresponding to the new layout may be produced.

The embodiments of the present disclosure discussed herein offer several advantages, it being understood that other embodiments may offer different advantages, and that no particular advantage is required for any embodiment. For example, FinFET region boundaries can be automatically defined using the methods discussed herein. The entity (e.g. a design house) that generates the initial layout need not to have the necessary tools to perform a FinFET layout and need not be concerned about FinFET design rules. Also, the plurality of iterations of FinFET boundary modifications discussed herein allow an optimized layout to be chosen, where the optimized layout may have the least number of FinFET Design Rule violations or the least number of total Design Rule violations. As such, the quality of the new layout is enhanced, which helps improve fabrication process stability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout for a semiconductor device, comprising:
   receiving a first layout;
   defining a portion of the first layout as a first FinFET region, the first FinFET region having first and second sides that each extend approximately in a first direction;
   performing, using an electronic design rule simulator that contains computer hardware, a first design rule check (DRC) simulation;
   obtaining a first DRC simulation result;
   defining a plurality of mandrel regions, the mandrel regions each including a first elongate edge and a second elongate edge opposite the first elongate edge, wherein the first and second elongate edges each extend approximately in the first direction;
   defining a plurality of first fin regions and a plurality of second fin regions different from the first fin regions, wherein the plurality of first fin regions are defined to be bordering the first elongate edges of a subset of the mandrel regions, respectively, and wherein the plurality of second fin regions are defined to be bordering the second elongate edges of the subset of the mandrel regions, respectively;
   thereafter defining a second FinFET region by moving the first side in a second direction perpendicular to the first direction, wherein the defining the second FinFET region further includes moving the mandrel regions, without changing spacings between adjacent mandrel regions, in the second direction together with the first side;
   performing, using the electronic design rule simulator, a second DRC simulation;
   obtaining a second DRC simulation result;
   selecting one of the first and second FinFET regions based on the first and second DRC simulation results;
   generating a second layout using the selected FinFET region; and
   storing the second layout in a non-transitory, tangible computer readable medium.

2. The method of claim 1, wherein:
   the first DRC simulation result includes a first number of FinFET design rule violations that are associated with the first FinFET region;
   the second DRC simulation result includes a second number of FinFET design rule violations that are associated with the second FinFET region; and
   the selecting is carried out in a manner so that one of the first and second FinFET regions with fewer FinFET design rule violations is selected.

3. The method of claim 1, wherein the defining the second FinFET region is carried out in a manner so that the first side is moved away from the second side.

4. The method of claim 1, wherein the receiving the first layout and the defining the first FinFET region are carried out in a manner so that the FinFET region includes an active region; and wherein the active region has the same position in both the first and second FinFET regions.

5. The method of claim 1, wherein the defining the second FinFET region is carried out in a manner so that the first side and the plurality of mandrel regions are each moved by a distance that is a function of a finest resolution of the first layout.

6. The method of claim 1, wherein the defining the mandrel regions is carried out in a manner so that at least one of the mandrel regions is bisected by the first side of the FinFET region.

7. The method of claim 1, further including fabricating a semiconductor device based on the second layout.

8. The method of claim 1, wherein the first and second FinFET regions each encompass a plurality of non-contiguous individual active regions, wherein at least some of the individual active regions are shaped differently from other individual active regions.

9. The method of claim 1, wherein the defining of the second FinFET region comprises moving the plurality of first fin regions and the plurality of second fin regions to correspond with a movement of the mandrel regions.

10. A method, comprising:
    defining a portion of an initial layout plan as an initial FinFET region, the initial FinFET region having first and second sides that each extend substantially in a first direction, wherein the initial FinFET region contains a plurality of active regions that are segregated from one another;
    performing an initial design rule check (DRC) simulation based on the initial FinFET region;
    collecting initial DRC simulation results from the initial DRC simulation;
    defining a plurality of mandrel regions, the mandrel regions each including two opposite elongate edges that each extend approximately in the first direction, at least one of the mandrel regions being bisected by the first side of the initial FinFET region;
    defining a plurality of fin regions in a manner such that, for each mandrel region in at least a subset of the mandrel regions, two different fins regions are defined to be abutted to the two opposite elongate edges of that mandrel region, respectively, and wherein none of the fin regions is abutted to more than one mandrel region;
    performing a plurality of layout iterations until a predefined condition is satisfied, each layout iteration including:

shifting the first side away from the second side by a distance measured in a second direction substantially perpendicular to the first direction, thereby defining a modified FinFET region;

performing a modified DRC simulation based on the modified FinFET region; and collecting modified DRC simulation results from the modified DRC simulation;

wherein the shifting is carried out in a manner so that, for each layout iteration, the distance by which the first side is shifted increases, and the mandrel regions are shifted without changing spacings between adjacent mandrel regions;

comparing the initial DRC simulation results with the modified DRC simulation results associated with each layout iteration;

choosing, in response to the comparing, an optimized FinFET region from the group consisting of the initial FinFET region and the modified FinFET regions defined by the plurality of layout iterations;

generating an updated layout plan based on the optimized FinFET region; and fabricating a FinFET device using the updated layout plan.

11. The method of claim 10, wherein:

the performing the layout iterations is carried out in a manner so that locations of the active regions remain unchanged during each layout iteration.

12. The method of claim 10, wherein:

the defining the mandrel regions is carried out in a manner so that each of the mandrel regions is separated in the second direction from adjacent mandrel regions by a spacing; and the shifting the first side is carried out in a manner so that, for each layout iteration, the distance by which the first side is shifted increases by a fixed amount, the spacing being an integer multiple of the fixed amount.

13. The method of claim 12, wherein the shifting is carried out in a manner so that the fixed amount is substantially equal to a finest resolution of the initial layout plan.

14. The method of claim 12, wherein the predefined condition is satisfied if the distance by which the first side is shifted is substantially equal to the spacing that separates adjacent mandrel regions.

15. The method of claim 10, wherein:

each of the DRC simulation results indicate a respective number of FinFET design rule violations; and the comparing includes comparing the respective number of FinFET design rule violations associated with each of the DRC simulation results.

16. The method of claim 15, wherein the choosing is carried out in a manner so that the optimized FinFET region is the FinFET region associated with the least number of FinFET design rule violations.

17. The method of claim 10, wherein for each layout iteration, the fin regions are shifted to correspond with a shifting of the mandrel regions.

18. An apparatus comprising a non-transitory, tangible computer readable storage medium storing a computer program for modifying a layout of a semiconductor device, wherein the computer program has instructions that when executed, carries out:

defining a portion of the initial layout plan as an initial FinFET region, the initial FinFET region having first and second sides that each extend substantially in a first direction, wherein the initial FinFET region encompasses a plurality of active regions that are separated from one another;

performing a design rule check (DRC) simulation based on the initial FinFET region;

gathering DRC results for each DRC simulation;

defining a plurality of elongate mandrel regions in the initial FinFET region, wherein the elongate mandrel regions each include an elongate first border and an elongate second border;

defining a plurality of first fin regions and a plurality of second fin regions that are mutually exclusive with the first fin regions, wherein the first fin regions share the first borders with a subset of the elongate mandrel regions, respectively, and wherein the second fin regions share the second borders with the subset of the elongate mandrel regions, respectively;

repeating the defining the portion of the initial layout plan, the performing, and the gathering for a plurality of iterations, the iterations respectively defining a plurality of revised FinFET regions by moving the first side away from the second side in a second direction perpendicular to the first direction, wherein the first side is moved by an increasing amount for each iteration, wherein the defining the portion of the initial layout plan includes moving the mandrel regions jointly with the first side in the second direction by a distance that is a function of a resolution of the layout, and wherein the moving of the mandrel regions is performed without changing spacings between adjacent mandrel regions;

thereafter selecting one FinFET region from the group consisting of the initial FinFET region and the revised FinFET regions; and generating a modified layout that contains the selected FinFET region.

19. The apparatus of claim 18, wherein:

the instructions for gathering DRC results include instructions for gathering a number of FinFET design rule errors for each DRC simulation; and the instructions for selecting the one FinFET region include instructions for selecting the FinFET region associated with the least number of FinFET design rule errors.

20. The apparatus of claim 18, wherein:

the instructions for repeating the defining include instructions for maintaining the same locations of the active regions in all the revised FinFET regions.

* * * * *